United States Patent [19]

Abita

[11] 3,824,014

[45] July 16, 1974

[54] RELIEF MASK FOR HIGH RESOLUTION PHOTOLITHOGRAPHY

[75] Inventor: Joseph L. Abita, Columbia, Md.

[73] Assignee: The United States of America as represented by the Secretary of the Navy, Washington, D.C.

[22] Filed: July 26, 1973

[21] Appl. No.: 383,023

[52] U.S. Cl. .................... 355/75, 117/5.5, 117/8.5, 117/38, 117/212, 118/504, 156/11

[51] Int. Cl. .... G03b 27/62, B44d 1/52, B05c 11/16

[58] Field of Search ............ 118/504, 505; 117/5.5, 117/8.5, 38, 212; 156/11, 16; 355/75

[56] References Cited

UNITED STATES PATENTS

| | | | |
|---|---|---|---|
| 3,193,408 | 7/1965 | Triller | 117/212 |
| 3,276,423 | 10/1966 | Triller | 118/504 |
| 3,647,533 | 3/1972 | Hicks | 118/505 X |
| 3,678,892 | 7/1972 | Fairchild | 118/504 |

*Primary Examiner*—Joseph F. Peters, Jr.
*Assistant Examiner*—Richard A. Wintercorn

[57] ABSTRACT

A mask comprising a mask pattern disposed on the planar surface of a raised mound extending from a flat backing plate, the invention insuring intimate contact between the mask pattern and a substrate surface to be masked even though said substrate surface may have an excess deposit of photoresist or other material around the perimeter thereof.

2 Claims, 3 Drawing Figures

PATENTED JUL 16 1974 3,824,014

PRIOR ART

RELIEF MASK FOR HIGH RESOLUTION PHOTOLITHOGRAPHY

BACKGROUND OF THE INVENTION

1. Field of the Invention

The invention relates to mask construction for employment in the photo fabrication of microminiature electronic devices, particularly those devices requiring the use of high resolution photolithographic techniques in the fabrication thereof.

2. Description of the Prior Art

A critical factor in the fabrication of microelectronic devices, especially those devices requiring high resolution, is the precise masking ability of mask apparatus used in the fabrication of said devices. Masks may be deposited on a substrate by various chemical and physical techniques or may be mechanical in nature. The chemical-type masks require several additional fabrication steps both in the application of the mask and in the removal thereof. Mechanical masks therefore present certain advantages, such as in reduction of fabrication time, reuseability, etc. The use of mechanical masks in high resolution work, such as in photolithographic production of semiconductor or microelectronic devices, is hindered by the ability of excessive deposits of photoresist or other material often left around the outer edges of a substrate to prevent intimate contact between the masking pattern and the surface of the substrate. The present masking apparatus eliminates this problem, thereby rendering the use of mechanical masks more acceptable in high resolution photolithographic production of microelectronic devices.

SUMMARY OF THE INVENTION

Photolithographic techniques have long been used to produce circuit patterns in thin film overlays necessary for hybrid and semiconductor microelectronic package fabrication. A usual step in these processing techniques requires the deposition of photoresist material onto a substrate, the substrate subsequently being covered by a masking device so that a particular circuit pattern may be developed on the surface of the substrate. Excessive build-up of this photoresist material often prevents intimate contact between the masking device and the substrate surface, the masking devices usually comprising flat plate-like members which are blocked from full face-to-face contact with the substrate surface by the irregularly raised portions of photoresist material. Although this unsatisfactory contact between the masking device and the surface of the substrate may be tolerated for low resolution work, satisfactory yields for high resolution work requires that essentially no spatial separation exists between the masking device and the substrate surface.

The present invention provides a masking device wherein a masking pattern is disposed on the planar surface of a raised mound, which mound extends centrally from the surface of a flat backing plate. The raised mound is reduced in size relative to the backing plate so that the mound may extend toward contact with a substrate surface to be masked despite the presence of excessive deposits of photoresist material about the perimeter of the substrate, which deposits would normally prevent contact between a flat masking plate and the surface of the substrate.

It is therefore an object of the invention to provide a masking apparatus for use in high resolution photolithographic processing of microelectronic elements which is structured to produce intimate contact between a masking pattern on the apparatus and the surface of a substrate to be masked.

Other objects and advantages of the invention will become apparent in light of the following description of the preferred embodiment of the invention.

DESCRIPTION OF THE PREFERRED EMBODIMENT

Figure 1:
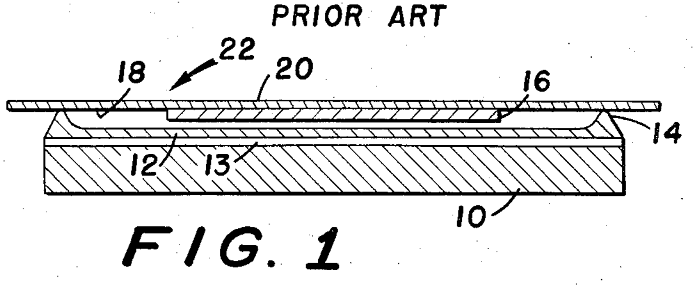
FIG. 1 is a sectional view in elevation of a prior art mask being applied to a substrate onto which an excess amount of photoresist material has built up about the perimeter of the substrate.

FIG. 1 illustrates the prior art situation to which the present invention is directed. As seen in FIG. 1, a substrate 10 onto which a circuit pattern is to be formed is shown after deposition thereon of a layer 12 of photoresist material. The layer 12 is usually deposited on a layer 13 of conductive material which surmounts the substrate 10. Even though care is used in the deposition of the layer 12, an undesirable excess build-up of the photoresist material usually occurs around the edges of the substrate 10, the excess photoresist material being shown at 14. This excess material 14 acts to prevent intimate contact between a masking pattern 16 on the surface 18 of mask body member 20, said pattern 16 and body member 20 comprising a mechanical mask 22. The mask 22 is used in the formation of a precise circuit pattern on the layer 12 of photoresist material in order that portions of the layer 12 may be developed in a well-known fashion. In order to produce a circuit pattern having acceptable electrical characteristics, the masking pattern 16 of the mask 22 must come into intimate contact with the surface of the photoresist layer 12. Bringing the pattern 16 and the surface of the layer 12 into contact is difficult due to the presence of the excess photoresist material 14 around the perimeter of the substrate 10 due to contact between the material 14 and the surface 18 of the mask body member 20.

Figure 2:
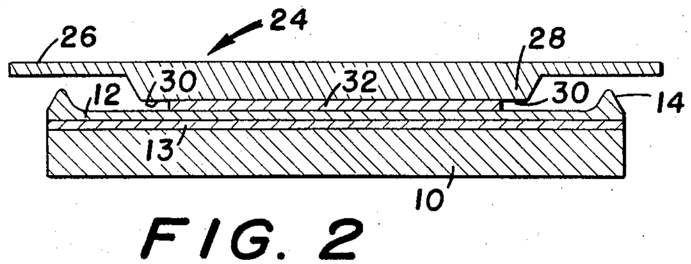
FIG. 2 is a sectional view in elevation of the present mask being applied to the same substrate shown in FIG. 1; and, FIG. 3 is a perspective view of the present mask.
Figure 3:
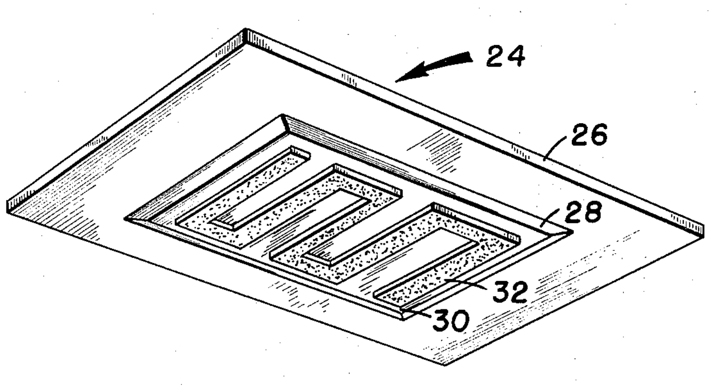

The present relief mask 24 is shown in FIGS. 2 and 3 to comprise a mask body member 26 and a raised central body portion 28 having a planar surface 30 thereon. A masking pattern 32 is disposed on the planar surface 30. Since the masking pattern 32 is located "in relief" on the raised central body portion 28, the excess photoresist material 14 does not prevent intimate contact between the pattern 32 and the surface of the photoresist layer 12. In effect, the raised body portion 28 of the present mask fits within the raised "edges" of photoresist material 14 disposed around the perimeter of the substrate 10. Thus, the planar surface 30 having the pattern 32 thereon firmly contacts the surface of the photoresist layer 12 onto which a circuit pattern is to be developed. The excess photoresist material 14 does not extend sufficiently high to contact the surface of the mask body member 26 to present an impediment to contact between the pattern 32 and the surface of the layer 12. In this manner, high resolution circuit patterns may be formed on the substrate 10.

Although the invention has been described by reference to a particular application, the concept is equally applicable to other applications wherein a masking apparatus is normally prevented from making satisfactory contact with the surface of a substrate due to excess deposits of material around the perimeter or over certain portions of the substrate.

I claim:

1. A pattern mask assembly particularly useful for high resolution photolithographic fabrication of microelectronic devices, comprising:

a mask body member;

a raised central body portion extending from said body member and terminating in a planar surface; and a masking pattern disposed on the planar surface of said raised central body portion.

2. A pattern mask apparatus for developing a circuit pattern on a layer of photoresist material disposed on a substrate, the photoresist material being present in excessive quantities around the perimeter of the substrate, thereby hindering intimate contact between the surface of the layer of photoresist material and a patterned mask, the mask apparatus comprising:

a mask body member having a planar surface;

a raised central body portion extending from the planar surface of said body member and having a planar surface surmounting said body portion, the second-mentioned planar surface having an area less than the area of the first-mentioned planar surface; and, masking pattern disposed on the second-mentioned planar surface of said raised central body portion, the masking pattern of said mask apparatus being readily brought into contact with the surface of the layer of photoresist on the aforementioned substrate due to the disposition of said masking pattern on the raised central body portion, which central body portion fits within the raised perimeter.

* * * * *